United States Patent [19]

Gakumura

[11] Patent Number: 4,811,096
[45] Date of Patent: Mar. 7, 1989

[54] VIDEO DETECTOR EMPLOYING PLL SYSTEM

[75] Inventor: Hiroki Gakumura, Higashiosaka, Japan

[73] Assignee: Sanyo Electric Co., Ltd., Osaka, Japan

[21] Appl. No.: 195,936

[22] Filed: May 19, 1988

[30] Foreign Application Priority Data

May 20, 1987 [JP] Japan .................. 62-123317
May 20, 1987 [JP] Japan .................. 62-123318

[51] Int. Cl.$^4$ .................. H04N 5/14; H04N 5/455
[52] U.S. Cl. .................. 358/160; 358/188; 358/193.1; 331/17
[58] Field of Search ............ 358/160, 21 R, 188, 358/191.1, 193.1, 195.1, 196; 331/17

[56] References Cited

U.S. PATENT DOCUMENTS

| | | | |
|---|---|---|---|
| 4,461,035 | 7/1984 | Sakamoto | 358/193.1 |
| 4,568,888 | 2/1986 | Kimura et al. | 331/17 |
| 4,578,706 | 3/1986 | Sakamoto | 358/193.1 |
| 4,590,440 | 5/1986 | Hague et al. | 331/17 |
| 4,660,087 | 4/1987 | Rumreich | 358/196 |

FOREIGN PATENT DOCUMENTS 58-210771 12/1983 Japan .
60-24784 2/1985 Japan .
61-198882 9/1986 Japan .

Primary Examiner—James J. Groody
Assistant Examiner—Michael D. Parker
Attorney, Agent, or Firm—Armstrong, Nikaido, Marmelstein & Kubovcik

[57] ABSTRACT

A PLL video detector comprises a phase detector circuit receiving a video intermediate frequency signal and an oscillation output of a VCO for phase-detecting the same. The phase of the oscillation output of the VCO is controlled by a signal obtained by smoothing a detection output of the phase detector circuit by a low-pass filter. In addition, a trap circuit having a center frequency of $f_H$ is provided between the phase detector circuit and the VCO, so that an unecessary component having a frequency of $f_H$ is removed from an output signal of the low-pass filter. Consequently, the VCO stably oscillates, so that occurrence of a buzz sound in a sound output and degradation of the picture quality can be prevented.

4 Claims, 3 Drawing Sheets

VIDEO DETECTOR EMPLOYING PLL SYSTEM

BACKGROUND OF THE INVENTION

1. Field of the Invention

The present invention relates generally to a video detector, and more particularly, to a video detector employing a PLL (Phase Locked Loop) system contained in an apparatus comprising a function of receiving a television signal, such as a television (referred to as TV hereinafter) receiver and a home video tape recorder (referred to as VTR hereinafter).

2. Description of the Prior Art

Conventionally, in an apparatus comprising a function of receiving a TV signal, such as a TV receiver and a VTR, a PLL system has been employed as a video detector circuit. More specifically, if such a video detector circuit employing the PLL system is used, a buzz sound caused by inclusion of a video signal in a sound signal in a transmission system of the TV signal can be reduced as well as differential gain (DG) and differential phase (DP) can be improved, so that a stable color image can be reproduced. Such a video detector circuit employing the PLL system is disclosed in, for example, Japanese Patent Laying-Open Gazette Nos. 210771/1983, 24784/1985 and 198882/1986.

FIG. 1 is a block diagram showing an example of a conventional TV signal receiving circuit using such a PLL video detector circuit.

Description is now made on structure of the circuit shown in FIG. 1. In FIG. 1, a TV signal received by a TV receiving antenna 1 and a TV tuner 2 is applied to a first surface wave filter 3 which is a bandpass filter enabling the passage of a signal component of 45.75 MHz and a second surface wave filter 4 which is a bandpass filter enabling the passage of a signal component of 41.25 MHz. A video intermediate frequency signal of 45.75 MHz extracted by the first surface wave filter 3 is applied to a first intermediate frequency amplifier circuit 5 while a sound intermediate frequency signal of 41.25 MHz extracted by the second surface wave filter 4 is applied to a second intermediate frequency amplifier circuit 6.

An output of the first intermediate frequency amplifier circuit 5 is applied to respective one inputs of a synchronous detector circuit 7 and a phase detector circuit 8. On the other hand, an oscillation output of a voltage controlled oscillator (referred to as VCO hereinafter) 9 which oscillates at the video intermediate frequency of 45.75 MHz is applied to the other input of the phase detector circuit 8. The phase detector circuit 8 outputs a signal corresponding to the phase difference between both the input signals to apply the same to a low-pass filter 10. The low-pass filter 10 smoothes an output of the phase detector circuit 8 to apply the same to the VCO 9, thereby to control the phase of the oscillation output of the VCO 9. The phase detector circuit 8, the VCO 9 and the low-pass filter 10 constitute a PLL portion 11. In addition, the oscillation output of 45.75 MHz of the VCO 9 is applied to the other input of the synchronous detector circuit 7 after shifting the phase thereof by 90° through a 90° phase sifter 12. A video signal synchronously detected by the synchronous detector circuit 7 is applied to a video signal processor circuit 14 after removal of the sound signal component thereof through a sound trap circuit 13. A video output from the video signal processor circuit 14 is outputted to the exterior through a video output terminal 15, to be applied to a monitor receiver or the like.

On the other hand, the sound intermediate frequency signal of 41.25 MHz outputted from the second intermediate frequency amplifier circuit 6 is applied to one input of a multiplier 16. In addition, the output of 45.75 MHz of the 90° phase shifter 12 is applied to the other input of the multiplier 16. An output of the multiplier 16 is applied to a bandpass filter 17 enabling the passage of a signal component of 4.5 MHz. An FM sound signal having a frequency of the difference between the video intermediate frequency of 45.75 MHz and the sound intermediate frequency of 41.25 MHz, i.e., a frequency of 4.5 MHz is extracted from the bandpass filter 17, to be applied to an FM detector circuit 18. A sound output from the FM detector circuit 18 is outputted to the exterior through a sound output terminal 19, to be applied to the monitor receiver or the like.

Description is now made on an operation of the conventional circuit shown in FIG. 1. In the circuit shown in FIG. 1, the video intermediate frequency signal of 45.75 MHz amplified by the first intermediate frequency amplifier circuit 5 and the oscillation output of 45.75 MHz of the VCO 9 are phase-detected by the phase detector circuit 8. The output of the phase detector circuit 8 corresponding to the phase difference therebetween is smoothed by the low-pass filter 10. The output of the low-pass filter 10 controls the phase of the oscillation output of the VCO 9 such that the phase difference between the video intermediate frequency signal and the oscillation output of the VCO 9 becomes 90°. The oscillation output of the VCO 9 is made in phase with the video intermediate frequency signal by shifting the phase thereof by 90° through the 90° phase shifter 12 and then, applied to the synchronous detector circuit 7 and the multiplier 16. The synchronous detector circuit 7 responsively detects synchronously the video intermediate frequency signal, to apply the detected video signal to the video signal processor circuit 14 through the sound trap circuit 13.

Assuming that the video signal is represented by;

$$V_V = A_0 k \cos(pt + \theta)$$

the carrier thereof is represented by;

$$V_C = A_0 \cos(W_c t + \phi_0)$$

a video intermediate frequency signal $e_{IF}$ obtained through amplitude modulation is as follows;

$$\begin{aligned} e_{IF} &= A_0\{1 + k\cos(pt + \theta)\} \cdot \cos(W_c t + \phi_0) \\ &= A_0 \cdot \cos(W_c t + \phi_0) + A_0 k/2 \cdot \cos\{(W_c + p)t + \phi_0 + \theta\} + A_0 k/2 \cdot \cos\{(W_c - p)t + \phi_0 - \theta\} \end{aligned}$$

where k is the modulation degree.

The phase detector circuit 8 is responsive to the video intermediate frequency signal $e_{IF}$ and a signal $V = \cos(W_c t + \Psi)$ having the video intermediate frequency outputted from the VCO 9 for outputting a signal $e_{PD}$ which is the product of both the signals;

$$\begin{aligned}
e_{PD} &= e_{IF} \times \cos(Wct + \psi) \\
&= A_0 \cdot \cos(Wct + \phi_0) \cdot \cos(Wct + \psi) + A_0k/2 \cdot \\
&\quad \cos\{(Wc + p)t + \phi_0 + \theta\} \cdot \cos(Wct + \psi) + A_0k/2 \cdot \\
&\quad \cos\{(Wc - p)t + \phi_0 - \theta\} \cdot \cos(Wct + \psi) \\
&= A_0/2 \cdot \{\cos(2Wct + \phi_0 + \psi) + \cos(\phi_0 - \psi)\} + \\
&\quad A_0k/4 \cdot [\cos\{(2Wc + p)t + \phi_0 + \theta + \psi\} + \cos \\
&\quad (pt + \phi_0 + \theta - \psi)] + A_0k/4 \cdot [\cos\{(2Wc - p)t + \\
&\quad \phi_0 - \theta + \psi\} + \cos(pt - \phi_0 + \theta + \psi)]
\end{aligned}$$

The output signal $e_{PD}$ is passed through the low-pass filter 10, whereby a frequency component of approximately 2 Wc is removed. More specifically, an output signal $e_{LPF}$ of the low-pass filter 10 is as follows:

$$\begin{aligned}
e_{LPF} &= A_0/2 \cdot \cos(\phi_0 - \psi) + A_0k/4 \cdot \{\cos(pt + \phi_0 + \\
&\quad \theta - \psi) + \cos(pt - \phi_0 + \theta + \psi)\} \\
&= A_0/2 \cdot \cos(\phi_0 - \psi) + A_0k/2 \cdot \cos(pt + \theta) \cdot \\
&\quad \cos(\phi_0 - \psi) \\
&= A_0/2 \cdot \cos(\phi_0 - \psi) \cdot \{1 + k\cos(pt + \theta)\}
\end{aligned}$$

Considering the ideal state in which capture of the PLL is achieved, the phase difference $(\phi_0 - \Psi)$ between the output of the VCO 9 and the video intermediate frequency signal is 90°. Thus, the output signal $e_{LPF}$ of the low-pass filter 10 becomes 0 V. As a result, the VCO 9 stably oscillates.

However, the video intermediate frequency signal is actually subjected to amplitude distortion and phase distortion because it passes through the first surface wave filter 3 provided on the input side of the first intermediate frequency amplifier circuit 5.

More specifically, the video intermediate frequency signal $e_{IF}$ inputted to the phase detector circuit 8 is subjected to the amplitude distortion and the phase distortion caused by the filter 3, actually to be a signal $e'_{IF}$ as shown below:

$$\begin{aligned}
e'_{IF} &= Y_0 A_0 \cos(Wct + \phi_0) + Y_{+p} A_0 k/2 \cdot \cos \\
&\quad \{(Wc + P)t + \phi_0 + \Delta\phi_{+p} + \theta\} + Y_{-p} A_0 k/2 \cdot \\
&\quad \cos\{(Wc - P)t + \phi_0 - \Delta\phi_{-p} - \theta\}
\end{aligned}$$

where $Y_0$ is the attenuation constant, and $\Delta\phi_{+p}$, $\Delta\phi_{-p}$ is phase distortion. Thus, the signal $e_{LPF}$ responsively outputted from the low-pass filter 10 is affected by such amplitude distortion and phase distortion, actually to be a signal $e'_{LPF}$ as shown below:

$$\begin{aligned}
e'_{LPF} &= Y_0 A_0/2 \cdot \cos(\phi_0 - \psi) + Y_{+p} A_0 k/4 \cdot \cos \\
&\quad (pt + \phi_0 + \Delta\phi_{+p} + \theta - \psi) + Y_{-p} A_0 k/4 \cdot \cos \\
&\quad (pt - \phi_0 + \Delta\phi_{-p} + \theta + \psi)
\end{aligned}$$

Thus, even if the phase difference $(\phi_0 - \Psi)$ between the output of the VCO 9 and the video intermediate frequency signal is 90° as described above, the second term and the third term in the signal $e'_{LPF}$ remain. Consequently, in order to achieve $e'_{LPF} = 0$, it is necessary to satisfy the following condition:

$$Y_{+p} = Y_{-p} \text{ and } \Delta\phi_{+p} = \Delta\phi_{-p}$$

FIG. 2 is a diagram showing bandwidth characteristics of the surface wave filter 3 shown in FIG. 1, where the axis of abscissa represents the angular velocity of the input signal and the axis of ordinate represents the amount of attenuation of the output signal. In the actual video detector circuit, a signal transmitted employing a vestigial sideband system is processed, so that amplitude characteristics and group delay characteristics of the above described surface wave filter can not be made flat in the vicinity of Wc, as shown in FIG. 2. Thus, since the above described condition $Y_{+p} = Y_{-p}$ and $\Delta\phi_{+p} = \Delta\phi_{-p}$ can not be achieved, the video intermediate frequency signal $e'_{IF}$ receives the distortion as shown in the positions of the angular velocities Wc, Wc+P and Wc−P. Thus, $e'_{LPF} = 0$ can not be achieved, so that stable oscillation of the VCO 9 is prevented.

The signal $e'_{LPF}$ having an angular velocity of pt outputted from the low-pass filter 10 particularly includes many signal components which are horizontal frequency components $(f_H, 2f_H, \ldots)$ in the video signal as unnecessary components. Such unnecessary video signal components are the cause of a grating buzz sound in the sound output as described below.

It is assumed that sound multiplexing broadcasting in Japan is received. In this case, a subchannel signal is demodulated by amplifying a composite sound signal detected by an SIF circuit to limit the amplitude thereof and then, extracting a $2f_H$ component, i.e., a subcarrier of the subchannel signal by the bandpass filter to frequency-modulate the same. However, a $f_H$ component among the above described unnecessary components included in the output of the low-pass filter generates a secondary higher harmonic of $2f_H$ at the time of amplification and limitation of the amplitude. The secondary higher harmonic of $2f_H$ is superposed on the subcarrier of $2f_H$ of the composite sound signal. As a result, a so-called stereo buzz is produced.

In addition, it is assumed that sound multiplexing broadcasting in the United States is received. In this case, the $2f_H$ component among the above described unnecessary components included in the output of the low-pass filter is included in the subchannel signal in which a carrier of $2f_H$ is suppressed to be transmitted employing a double sideband transmission system. As a result, at the time of demodulation, beat is produced between a carrier component of $2f_H$ created for restoring the above described suppressed carrier and the above described unnecessary component of $2f_H$. This beat degrades the distortion factor of stereo demodulation, which causes the buzz sound.

As described in the foregoing, since the unnecessary components in the output of the low-pass filter 10 shown in FIG. 1 prevent stable oscillation of the VCO 9, the unnecessary components significantly adversely affect the sound output as described above, while adversely affecting the differential gain and the differential phase, resulting in degradation of the picture quality such as the change of the color phase.

Additionally, in order to prevent the above described adverse effect, a method for increasing the time constant of the low-pass filter 10 to reduce the unnecessary components is considered. However, the capture range of the PLL becomes narrow, so that this method can not be employed.

SUMMARY OF THE INVENTION

Therefore, an object of the present invention is to provide a PLL video detector in which a so-called buzz sound in a sound output caused by unnecessary components included in a phase control signal of a voltage controlled oscillator circuit is prevented from being produced.

Another object of the present invention is to provide a PLL video detector in which degradation of the picture quality caused by unnecessary components included in a phase control signal of a voltage controlled oscillator circuit is prevented.

Still another object of the present invention is to provide a PLL video detector in which the sound quality and the picture quality can be improved without unnecessarily making narrower the capture range of a PLL.

Briefly stated, the PLL video detector according to the present invention comprises a voltage controlled oscillator circuit which oscillate at a video intermediate frequency as a center frequency, a phase detector circuit receiving a video intermediate frequency signal and an output of the voltage controlled oscillator circuit for phase-detecting the same, a low-pass filter for smoothing an output of the phase detector circuit to apply the same to the voltage controlled oscillator circuit as a phase control signal, a synchronous detector circuit receiving the video intermediate frequency signal and the output of the voltage controlled oscillator circuit for synchronously detecting the same, and a circuit for removing unnecessary components included in the phase control signal applied to the voltage controlled oscillator circuit from the low-pass filter.

In accordance with another aspect of the present invention, the unnecessary component removing circuit comprises a trap circuit for removing a signal component having a frequency n (n: positive integer) times a horizontal frequency $f_H$ of a video signal.

Thus, a principal advantage of the present invention is that the unnecessary components in the phase control signal applied to the voltage controlled oscillator circuit from the low-pass filter in the video detector are removed to ensure the stably oscillating state of the voltage controlled oscillator circuit, so that occurrence of a grating buzz sound and degradation of the picture quality can be prevented.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
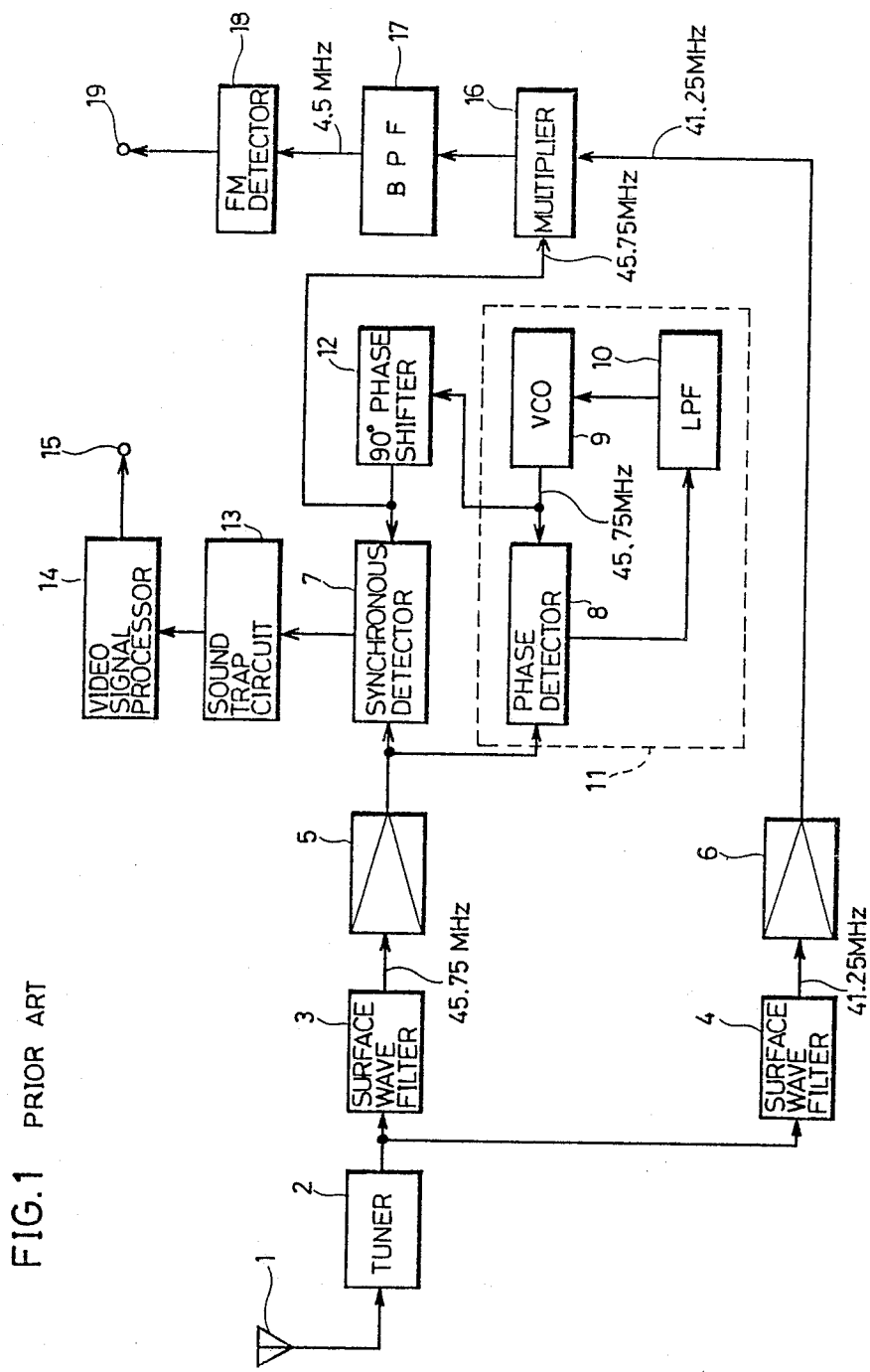
FIG. 1 is a block diagram showing an example of a TV signal receiving circuit using a conventional PLL video detector circuit.
Figure 2:
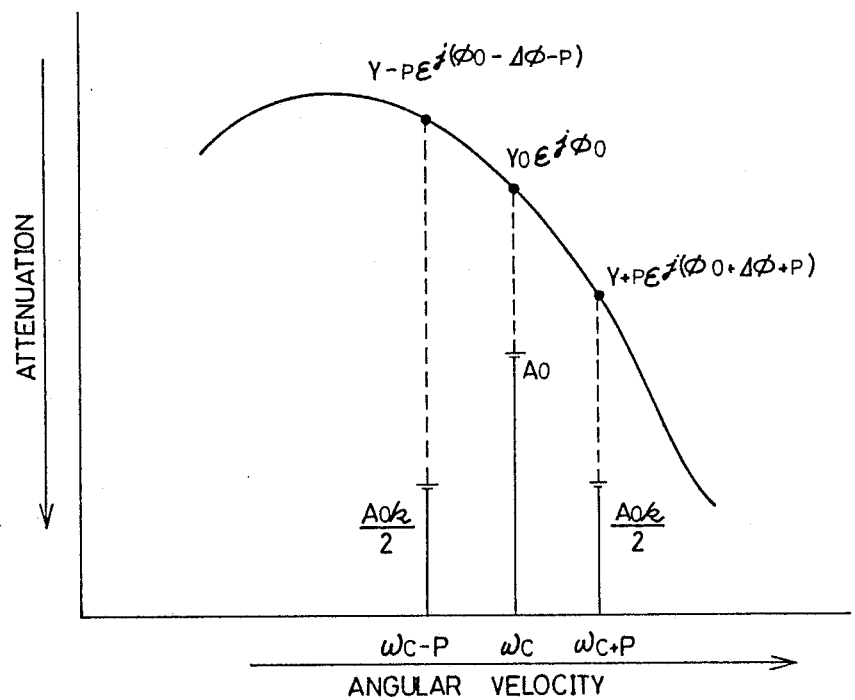
FIG. 2 is a graph showing bandwidth characteristics of a surface wave filter shown in FIG. 1.
Figure 3:
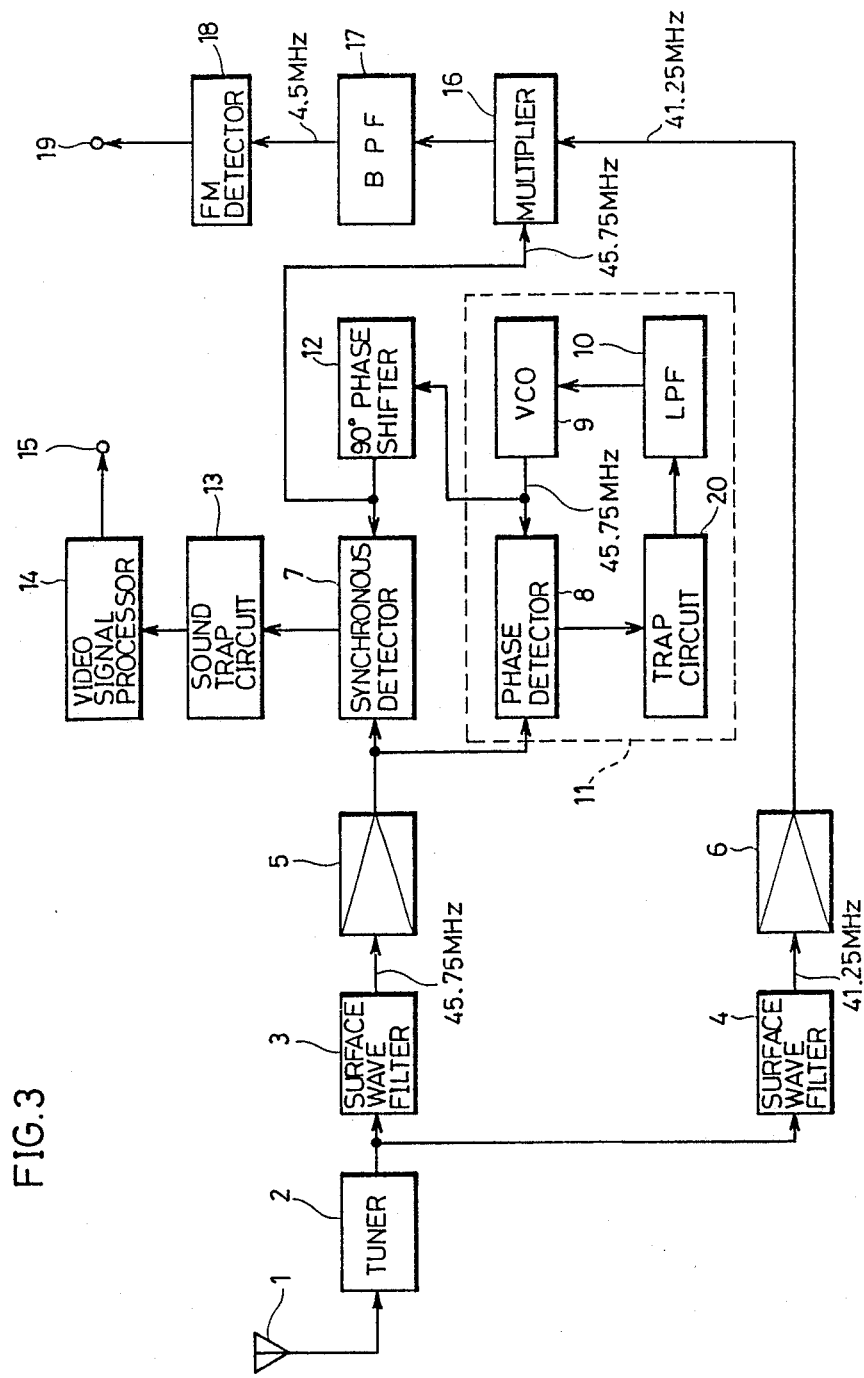
FIG. 3 is a block diagram showing a TV signal receiving circuit using a PLL video detector circuit according to an embodiment of the present invention.

FIG. 3 is a block diagram showing a TV signal receiving circuit using a PLL video detector circuit according to an embodiment of the present invention. The embodiment shown in FIG. 3 is the same as the conventional circuit shown in FIG. 1 except for the following.

More specifically, a trap circuit 20 having a center frequency of $f_H$ (15.75 KHz) is provided between a phase detector circuit 8 and a low-pass filter 10. The trap circuit 20 can be formed by a well-known LC series resonance circuit, an active filter or the like.

Thus, in the state in which a phase locked loop is locked, a $f_H$ component among unnecessary components included in an output of the phase detector circuit 8 is considerably attenuated by the trap circuit 20 having a center frequency of $f_H$, so that the $f_H$ component is not included in an output of the low-pass filter 10. As a result, an oscillation output of a VCO 9 does not change depending on the $f_H$ component in the output of the low-pass filter 10. Thus, the $f_H$ component does not interfere with a video detection output, so that occurrence of a stereo buzz in a sound output can be prevented.

In addition, it is assumed that the present invention is applied to a sound multiplex TV receiver in the United States. In this case, if the center frequency of the trap circuit 20 is set to $2f_H$ (31.5 KHz), the distortion factor at the time of stereo demodulation can be improved, to prevent occurrence of the buzz sound in the sound output.

Furthermore, the center frequency of the trap circuit 20 may be set between $f_H$ and $2f_H$ to attenuate at a time both signal components of $f_H$ and $2f_H$ in the output of the low-pass filter 10, providing that the trap circuit 20 can attenuate both the signal components to some extent.

Additionally, although in the embodiment shown in FIG. 3, the trap circuit 20 is provided between the phase detector circuit 8 and the low-pass filter 10, it may be provided between the low-pass filter 10 and the VCO 9, to obtain the same effect.

As described in the foregoing, according to the embodiment of the present invention, since the trap circuit 20 for removing unnecessary components included in the output of the low-pass filter 10 is provided, the video detection output and the sound detection output are not adversely affected by the unnecessary components. In particular, at the time of receiving sound multiplexing broadcasting, the buzz sound is prevented from being produced, so that good sound quality as well as good picture quality can be obtained.

Additionally, the time constant of the low-pass filter 10 need not be increased, so that the capture range of the PLL can be made wider.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A PLL video detector comprising:
   means for supplying a video intermediate frequency signal,
   voltage controlled oscillator means which oscillate at a video intermediate frequency as a center frequency,
   the phase of an output of said voltage controlled oscillator means being controlled by a control signal,
   phase detector means receiving said video intermediate frequency signal and the output of said voltage controlled oscillator means for phase-detecting the same, to apply a phase detection output, low-pass filter means for smoothing said phase detection output, to apply the same to said voltage controlled oscillator means as said control signal, synchronous detector means receiving said video intermediate frequency signal and the output of said voltage controlled oscillator means for synchronously detecting the same, to apply a video detection output, phase shifter means for providing the phase difference between the output of said voltage controlled oscillator means applied to said phase detector means and the output of said voltage controlled oscillator means applied to said synchronous detector means, and means provided between said phase detector means and said voltage controlled oscillator means for removing unnecessary components in the control signal applied to said voltage controlled oscillator means from said low-pass filter means at the time of oscillation of said voltage controlled oscillator means.

2. A PLL video detector according to claim 1, wherein
said unnecessary component removing means comprises a trap circuit for removing a signal component having a frequency n (n: positive integer) times a horizontal frequency $f_H$ of said video signal.

3. A PLL video detector according to claim 2, wherein
said trap circuit removes signal components of $f_H$ and $2f_H$.

4. A PLL video detector according to claim 3, wherein
said trap circuit has a center frequency between $f_H$ and $2f_H$, and substantially reduces said signal components of $f_H$ and $2f_H$.

* * * * *